(12) United States Patent
Field

(10) Patent No.: US 9,716,512 B2
(45) Date of Patent: *Jul. 25, 2017

(54) ASYNCHRONOUS LOW-POWER ANALOG-TO-DIGITAL CONVERTER CIRCUIT WITH CONFIGURABLE THRESHOLDS

(71) Applicant: Intel Corporation, Santa Clara, CA (US)

(72) Inventor: Ryan M. Field, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/067,058

(22) Filed: Mar. 10, 2016

(65) Prior Publication Data

US 2016/0197618 A1    Jul. 7, 2016

Related U.S. Application Data

(63) Continuation of application No. 14/495,570, filed on Sep. 24, 2014, now Pat. No. 9,312,876.

(51) Int. Cl.
*H03M 1/34* (2006.01)
*H03M 1/46* (2006.01)
(Continued)

(52) U.S. Cl.
CPC .............. *H03M 1/46* (2013.01); *G06F 13/24* (2013.01); *H03M 1/06* (2013.01); *H03M 1/1245* (2013.01); *H03M 1/42* (2013.01); *Y02B 60/1228* (2013.01)

(58) Field of Classification Search
CPC ............ H03M 1/34; H03M 1/38; H03M 1/40; H03M 1/42; H03M 1/46; H03M 1/462; H03M 1/1245

(Continued)

(56) References Cited

U.S. PATENT DOCUMENTS 4,989,004 A    1/1991  Kanayama
5,541,601 A    7/1996  Goto et al.
(Continued)

FOREIGN PATENT DOCUMENTS

TW        544994 B    8/2003
TW    200503428 A    1/2005

OTHER PUBLICATIONS

Agarwal, R., "Adaptive Asynchronous Analog to Digital Conversion for Compressed Biomedical Sensing", IEEE Magazine, 2009, pp. 69-72.

(Continued)

*Primary Examiner* — Khai M Nguyen
(74) *Attorney, Agent, or Firm* — Blakely, Sokoloff, Taylor & Zafman LLP

(57) ABSTRACT

An analog-to-digital converter circuit is described that includes register space to keep one or more values to establish upper and lower thresholds of the analog-to-digital converter. The analog-to-digital converter circuit also includes first and second comparators to compare an analog input signal against the upper and lower thresholds and to trigger an analog-to-digital conversion process in response to the analog input signal crossing one of the thresholds. The analog-to-digital converter circuit also includes first logic circuitry to discard a result of the analog-to-digital conversion process if the result is within a prior analog-to-digital conversion process's thresholds. The analog-to-digital converter circuit also includes second logic circuitry to provide the result as an output and generate an interrupt if the result is not within the prior analog-to-digital conversion process's thresholds.

20 Claims, 5 Drawing Sheets

(51) Int. Cl.
    *H03M 1/12*     (2006.01)
    *G06F 13/24*    (2006.01)
    *H03M 1/06*     (2006.01)
    *H03M 1/42*     (2006.01)

(58) Field of Classification Search
    USPC .......................................... 341/118, 155, 163
    See application file for complete search history.

(56) References Cited

U.S. PATENT DOCUMENTS

| | | |
|---|---|---|
| 5,654,708 A | 8/1997 | Boehl et al. |
| 6,163,291 A | 12/2000 | Uchino et al. |
| 6,424,284 B1 | 7/2002 | Lopata et al. |
| 6,816,104 B1 | 11/2004 | Lin |
| 7,205,921 B1 | 4/2007 | Savla |
| 7,626,529 B2 | 12/2009 | Robert |
| 7,649,489 B2 | 1/2010 | Konrad et al. |
| 9,312,876 B1 * | 4/2016 | Field .................. H03M 1/1245 |
| 2002/0121998 A1 | 9/2002 | Yamazaki |
| 2015/0378954 A1 | 12/2015 | Field et al. |

OTHER PUBLICATIONS

Allier, E., "A 120nm Low Power Asynchronous ADC", ISLPED, Aug. 8-10, 2005 San Diego, CA USA, pp. 60-65.

Trakimas, M., "A 0.8 V Asynchronous ADC for Energy Constrained Sensing Applications" IEEE 2008 Custom Intergrated Circuits Conference (CICC), pp. 173-176.

* cited by examiner

ASYNCHRONOUS LOW-POWER ANALOG-TO-DIGITAL CONVERTER CIRCUIT WITH CONFIGURABLE THRESHOLDS

RELATED CASES

This application is a continuation of and claims the benefit of U.S. patent application Ser. No. 14/495,570, titled "ASYNCHRONOUS LOW-POWER ANALOG-TO-DIGITAL CONVERTER CIRCUIT WITH CONFIGURABLE THRESHOLDS", filed Sep. 24, 2014, which is incorporated by reference in its entirety.

FIELD OF INVENTION

The field of invention pertains to electronics generally, and, more specifically, to an asynchronous, low power ADC circuit with configurable thresholds.

BACKGROUND

Successive approximation circuits are often used to implement analog-to-digital converters (ADCs). FIG. 1 shows a prior art successive approximation ADC circuit 100. As observed in FIG. 1, the successive approximation ADC includes a sample-and-hold circuit 101 to receive an analog input signal. The sample-and-hold circuit samples the analog input signal when a next analog-to-digital conversion operation is to begin and "holds" this signal at the sampled value throughout the conversion. In the case where the analog input signal is a voltage, sample and hold circuit 101 may be implemented, e.g., with a capacitor in series with a switch. The switch can be normally closed and when an analog-to-digital conversion operation is to begin, the switch is opened holding the input voltage on the capacitor.

The held analog signal is fed to a comparator circuit 102 which serves to generate a difference signal (or error term) for a feedback loop that includes a successive approximation logic block 103, a successive approximation register 104 and a digital to analog (DAC) converter 105. As will be explained in more detail immediately below, an analog-to-digital conversion operation is performed by recursively performing a number of successive approximations through the feedback loop.

For the initial recursion of an analog-to-digital conversion operation, the successive approximation logic block 103 provides a digital value to its successive approximation register 104 that is approximately halfway between the numeric range of the register's digital output bit width. Other implementations of the successive approximation may choose to start at another value such as a maximum value, a minimum value, a last value or any other value. For simplicity the remainder of the instant docket will refer to an implementation in which the successive approximation approach starts at a halfway value.

The "halfway" value is typically implemented by setting the highest ordered bit in the successive approximation register 104 "high" while keeping each of the remaining lower ordered bits "low". For example, if the successive approximation register 104 has an eight bit output, its numeric output range is 256 ($2^8$=256). Setting the highest ordered bit high corresponds to a "halfway" value of 128 (10000000). Each successive approximation recursion ends with a new value being presented in the successive approximation register 104. Thus, at this point, the first recursion for the analog-to-digital conversion operation is completed.

The halfway value from the successive approximation register 104 is then converted by the DAC 105 to an analog signal that is nominally situated halfway within the designed-for input dynamic range of the ADC circuit 100. The input signal being held by the sample and hold circuit 101 is then compared against the signal generated by the DAC 105. The output signal from the comparator 102 in response to the comparison begins the next recursion of the analog to digital conversion operation.

If the signal from the DAC 105 is less than the held input signal from the sample and hold circuit 101, the comparator 102 sends an increment ("up") signal to the successive approximation logic 103. In response to an increment signal, the successive approximation logic 103 keeps the higher ordered bit(s) from the previous recursion(s) in the digital output signal of the successive approximation register 104 and sets the next highest ordered bit to be "high" (e.g., in the case where the first recursion output was 10000000, the second recursion output would be 11000000).

By contrast, if the signal from the DAC 105 is larger than the held input signal from the sample and hold circuit 101, the comparator 102 sends a decrement ("down") signal to the successive approximation logic 103. In response to the decrement signal, the successive approximation logic 103 decrements the value of the higher ordered bit(s) from the previous recursion(s) in the digital output signal of the successive approximation register 104 and sets the next highest ordered bit to be "high" (e.g., in the case where the first recursion output was 10000000, the second recursion output would be 01000000 or 0111111).

As can be appreciated, according to this operation the digital output of the successive approximation register 104 will approach the value of the input signal with each next recursion and will eventually reach a steady state when the difference between the output of the DAC 105 and the input signal is equal to or less than the output resolution of the DAC 105. At this point, the value of the successive approximation register is latched into an output register 106 so that the formal output of the ADC can be provided.

FIGURES

A better understanding of the present invention can be obtained from the following detailed description in conjunction with the following drawings, in which.

DETAILED DESCRIPTION

Figure 1:
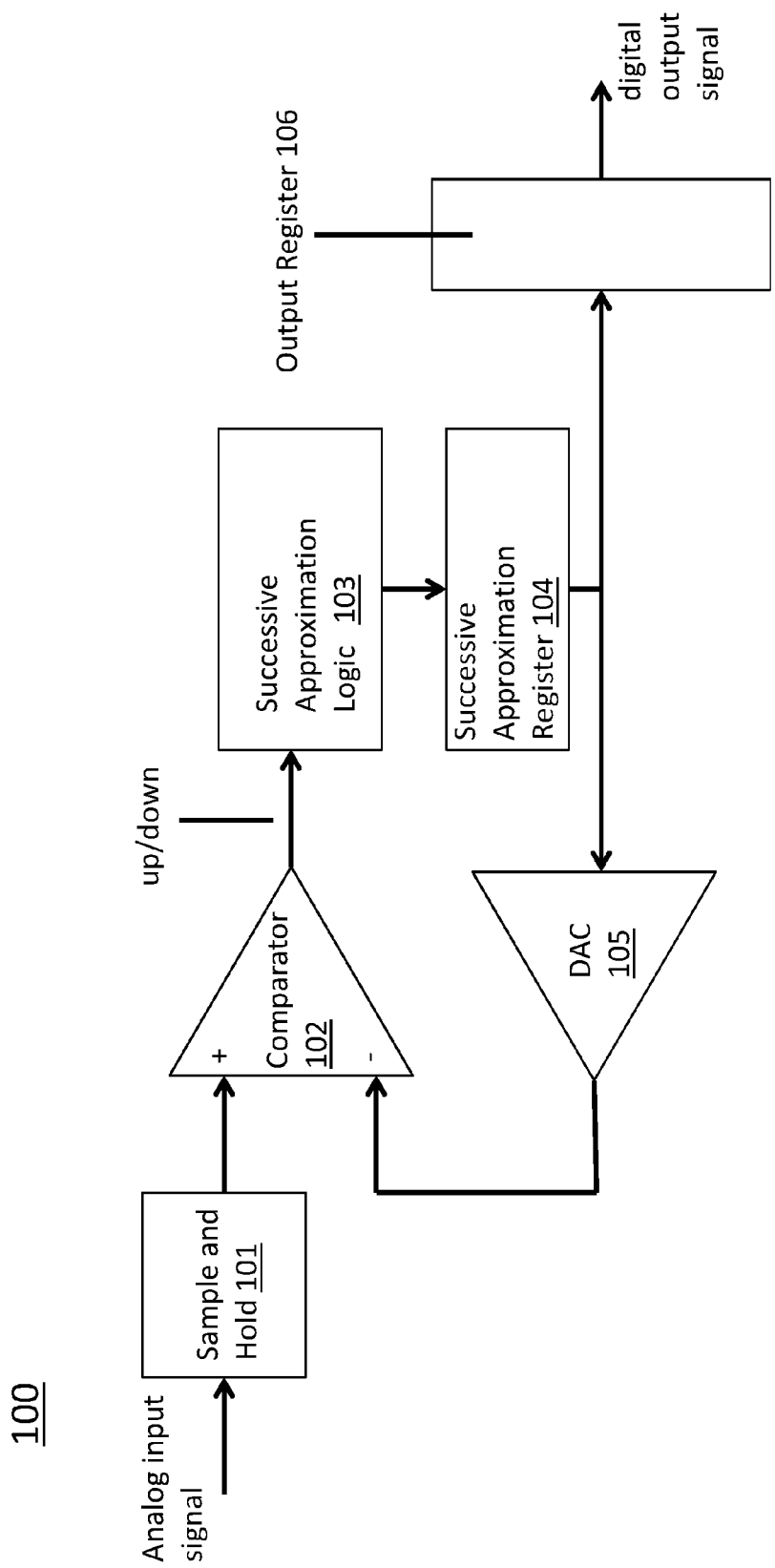
FIG. 1 (prior art) shows a successive approximation ADC circuit.

A problem with the successive approximation ADC circuit of FIG. 1 is that the circuit must be directed to sample the input (either by a continuously running a sampling clock or by a system controller that will request a new sample when it wishes to determine the current value of an input). This method of sampling/control requires a priori knowledge of the input signal and can lead to sub-optimal power consumption and data generation for signals that do not have well-defined frequency spectra. In the case where the analog input signal changes slowly over time and the polled nature of the circuit leads to repeated (i.e., identical) output values over a long run length of time, the circuit is not only consuming considerable power but also not providing any new information.

One approach to this problem has been to design an asynchronous ADC that triggers an analog-to-digital conversion sequence after the input signal has deviated from its previous value by some amount. Here, however, the "amount" of deviation is determined from the digital and not the analog realm by providing a next digital ADC output value if the input signal deviates by some number of least significant bits from the last formal digital output value of the ADC. These designs, therefore, do not provide any ability to manage or vary the threshold level at which deviation in the input signal will trigger the generation of a new ADC output. Additionally, they do not perform new conversions when the input has deviated from the previous value and can require many increments when the input has deviated by a substantial amount.

Figure 2:
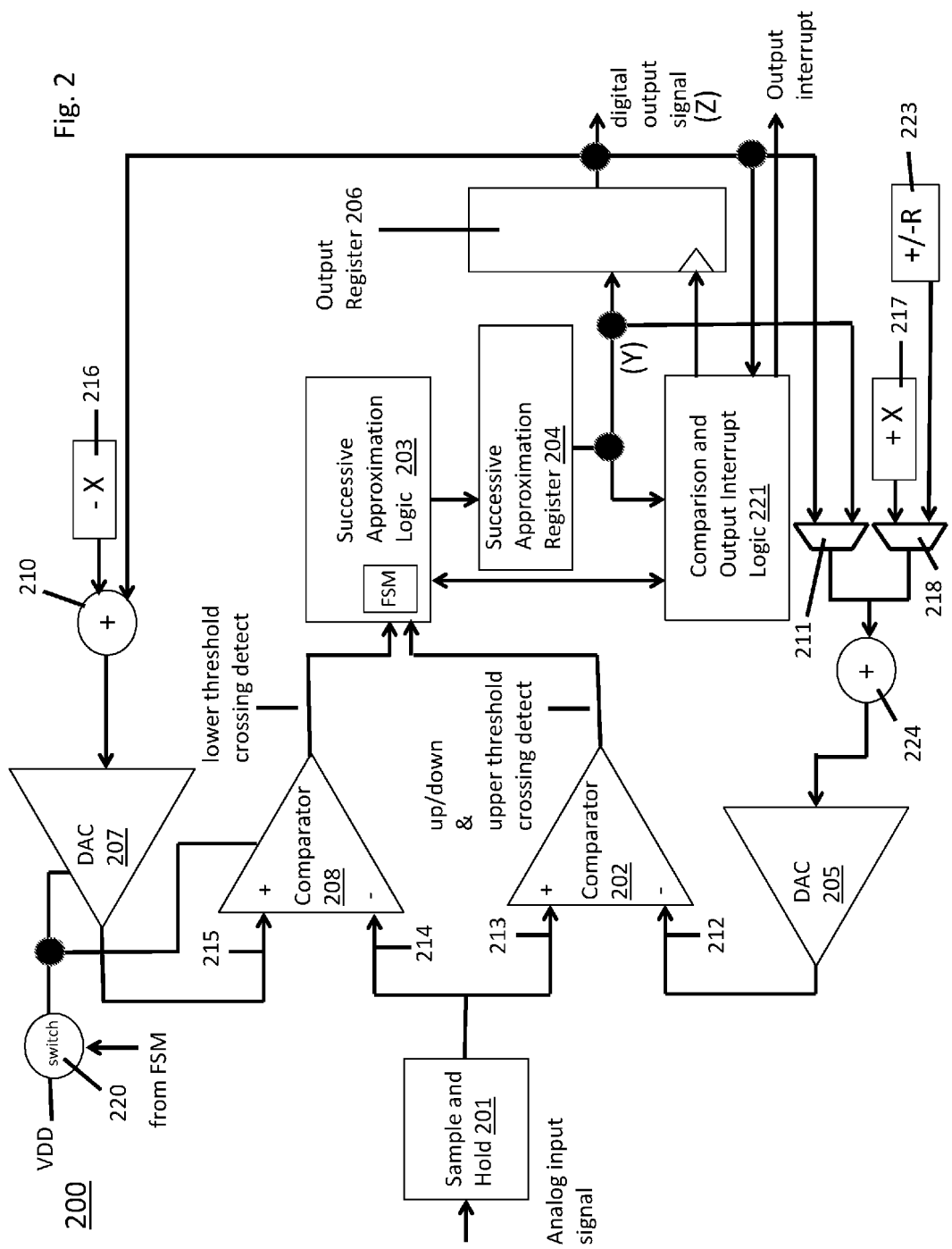
FIG. 2 shows an improved ADC circuit.

FIG. 2 shows an embodiment of an improved successive approximation ADC circuit 200 that triggers a next analog-to-digital conversion operation in response to the analog input signal surpassing a threshold relative to its value when the last analog-to-digital conversion operation was undertaken, where, the threshold itself is programmable. If the analog input signal drifts slowly over time, the ADC circuit will perform an analog-to-digital conversion operation when the signal has changed rather than continuously in a synchronous or polled fashion, and, the specific levels that trigger a next analog-to-digital conversion can be programmatically set, e.g., by a user or system so that the ADC can be optimized for the particular sensor (e.g., temperature sensor, pressure sensor, humidity sensor) that is generating the analog input signal.

The ADC circuit 200 of FIG. 2 includes a standard successive approximation ADC circuit 200 including a sample and hold circuit 201, a first comparator circuit 202, successive approximation logic 203, a successive approximation register 204, a first DAC circuit 205 and an output register 206. The ADC circuit of FIG. 2 additionally includes a second DAC circuit 207 and a second comparator circuit 208.

Moreover, the first comparator circuit 202 performs dual functions. Specifically, as described in more detail below, comparator circuit 202 not only generates the up/down difference signal for the analog-to-digital conversion operation recursions (as discussed in the Background section) but also operates as a threshold crossing detector that triggers the start of a next analog-to-digital conversion operation when the analog input signal crosses a threshold as described in more detail immediately below.

Figure 3:
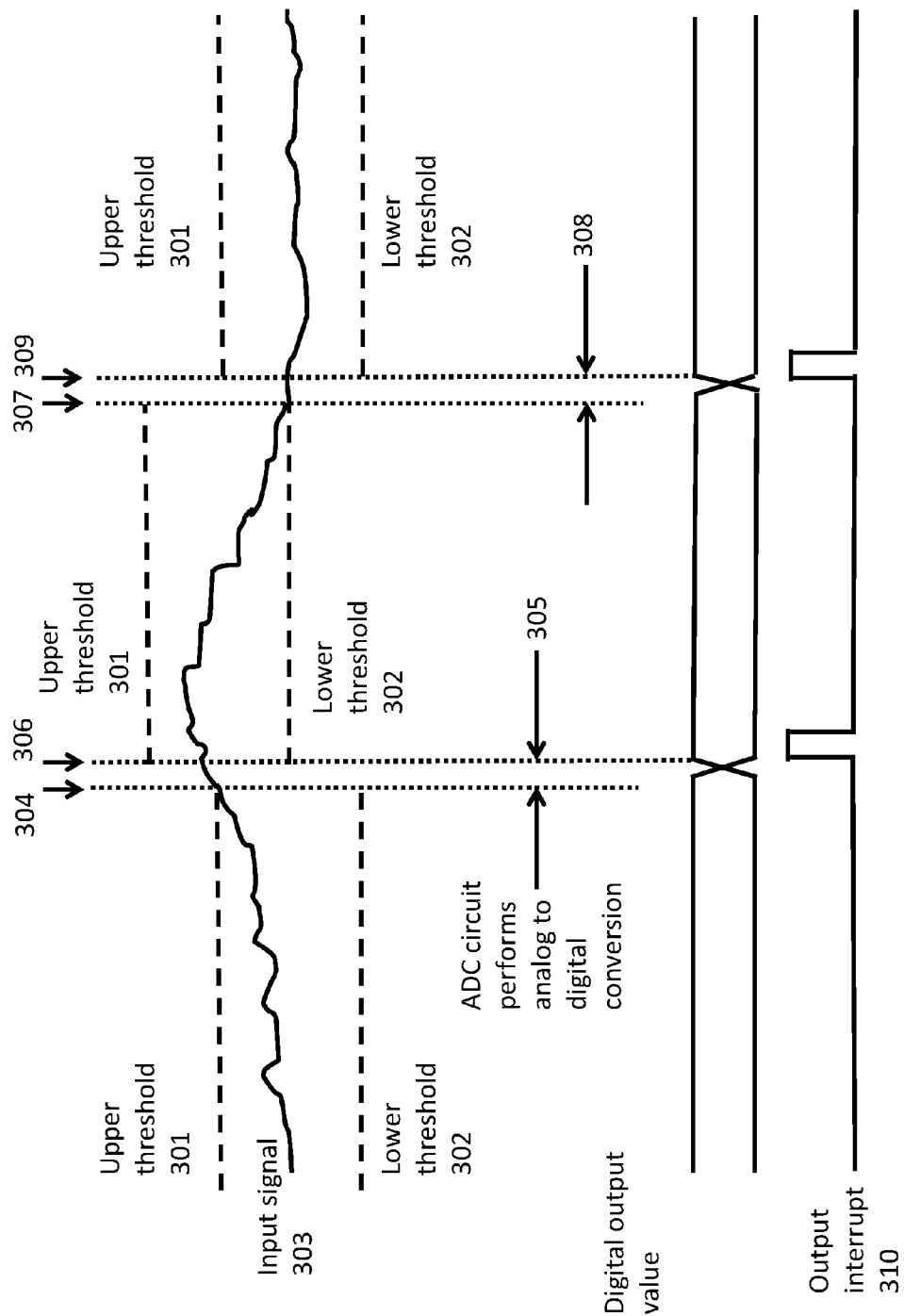
FIG. 3 shows a first methodology of operation of the improved ADC circuit of FIG. 2.

Referring to FIGS. 2 and 3, an upper threshold 301 is established by first DAC 205, and, a lower threshold 302 established by second DAC 207. The first comparator 202 will trigger a next analog-to-digital conversion operation if the analog input signal 303 rises above the upper threshold 301 established by the first DAC 205. Likewise, the second comparator 208 will trigger a next analog-to-digital conversion operation if the analog input signal 303 falls below the lower threshold 302 established by the second DAC 207.

For example, as observed in FIG. 3, analog input signal 303 is observed to rise above upper threshold 301 at time 304 which causes first comparator 202 to trigger (e.g., by asserting a high threshold crossing signal) a next analog-to-digital conversion operation over time period 305. At the conclusion of the sequence of recursions at which the final digital output value is reached in the successive approximation register 204 at time 306 the content of the successive approximation register 304 is transferred to the output register 306 to formally present a new digital output value. Additionally, both the upper and lower thresholds 301, 302 are reset to establish new thresholds above and below the new output value of the ADC.

At time 307, for the sake of continuing the example, the analog input signal 303 is observed to fall below the lower threshold 302 which causes the second comparator 208 to trigger (e.g., by asserting a low threshold crossing signal) a next analog-to-digital conversion operation over time period 308. Again, at the conclusion of the sequence of recursions in which a steady state output is reached by the ADC at time 309 both the upper and lower thresholds 301, 302 are again reset to establish new thresholds above and below the second new output value of the ADC.

Because the improved ADC circuit of FIG. 2 asynchronously initiates analog-to-digital conversion operations, whenever a new analog-to-digital conversion operation is performed, an interrupt signal 310 is generated commensurate with the new ADC output value to inform the higher level system that uses the output of the ADC that a new ADC output value has just been generated.

As observed in FIG. 2, the lower threshold is established by adding, via adder 210, a negative margin value to the output of the ADC. Thus, for instance, if the margin value is X and the ADC output value is Z, the adder 210 will provide a value of Z−X to the second DAC 207. By contrast, the upper threshold is established by adding, via adder 224, a positive margin value to the output of the ADC. Thus, for instance, if the margin value is again X and the ADC output value is Z, the adder 224 will provide a value of Z+X to the second DAC 205.

To formally set which comparator 202, 206 corresponds to the setting of an upper threshold or a lower threshold note the specific input arrangement to each of comparators 202, 208. In an embodiment, each comparator 202, 208 consists of a 3-terminal circuit with two analog inputs ($V_+$ and $V_-$) and one digital output. Each comparator 202, 208 will assert an output value that is "high" when the $V_+$ input is greater than the $V_-$ input. In the specific circuit implementation described here, when the ADC is not currently performing a conversion and the output is asserted high, the next analog-to-digital conversion is started.

Referring to the upper threshold comparator 202, note that, when multiplexer 218 is configured to select the path from the ADC output (rather than the path from the successive approximation register 204), an analog voltage level is generated by the DAC (205) that is equal to the fraction of the full-scale voltage represented by the ADC output value plus the margin (Z+X as discussed just above), which is applied to the $V_-$ input 212 and the analog input signal is fed to the $V_+$ input 213. Thus, according to the above description of a comparator, when the analog input signal rises above the ADC output plus the margin (the upper threshold, Z+X), the comparator output signal to start a next analog-to-digital conversion operation is triggered. Triggering such a signal when the analog input signal surpasses the ADC output plus the margin value corresponds to upper threshold crossing detection.

By contrast note that the input terminals 214, 215 of comparator 208 are swapped with respect to the input terminals 212, 213 of comparator 202. That is, the analog input signal is routed to the $V_-$ input 214 and the ADC output less the margin (Z−X) are routed to the $V_+$ input 215. As such, if the analog voltage represented by the ADC output less the margin rises above the level of the analog input signal, comparator 208 will trigger its output signal.

Said another way, an output signal will be triggered from comparator 208 because the input signal from the DAC has risen above the reference value from the sample-and-hold circuit. The ADC output less the margin rising above the level of the analog input signal is the same as the analog input signal falling below the ADC output less the margin. This, in turn, corresponds to lower threshold crossing detection.

Comparators 202, 208 can be identically designed but need not be identically designed. Here, as eluded to above, the ADC circuit 200 of FIG. 2 has two primary modes of operation: 1) input signal threshold crossing detection for triggering analog-to-digital conversion; and, 2) successive approximation operation for performing analog-to-digital conversion. The first comparator 202 participates in both modes of operation but the second comparator 208 participates in the first mode of operation.

In the first mode of operation both comparators 202, 208 will generate a trigger signal if the analog input signal crosses their respective threshold. In the second mode of operation, the first comparator generates an up/down signal for the successive approximation recursions. As such comparator 202 is designed to provide both types output signals. When acting as an upper threshold comparator, conceivably, comparator 202 can use the up/down signal output to signify its threshold has been surpassed (as the ADC will know what mode it is in). That is, the same output of comparator 202 can be used to provide both types of output signals. Additionally, the second comparator 208 could optionally be used to provide up/down signals during the successive approximation process for alternative algorithms. For example, using two comparators during the successive approximation algorithm would provide more detailed information about the value of the input relative to two thresholds (i.e. $V_{in}<V_{th1}$ or $V_{th1}<V_{in}<V_{th2}$ or $V_{th2}<V_{in}$). It is possible that such a successive approximation algorithm could be more efficient than a single threshold-based algorithm.

Note that the margins in the embodiment of FIG. 2 can be programmatically set (e.g., with program code such as system BIOS and/or device driver software or firmware) through registers 216, 217. In the examples discussed above where the margin was X for both the upper and lower threshold settings, a value of X would be programmed into both registers 216 and 217. Conceivably, there may be applications that desire different upper and lower margins (hence the two separate registers 216, 217). In more simplistic embodiments where the margin is to be the same for both the upper and lower thresholds, a single register can be used to provide the thresholds the single margin value.

The ability to program the thresholds permits a user or system to "set-up" or "tweak" the ADC for use with a specific sensor that is generating the analog signal. For instance, a pressure sensor can have a responsivity of approximately 0.5 mv/degree, a temperature sensor can have a responsivity of approximately 5 mv/degree, and a humidity sensor can have a responsivity of approximately 30 mv/% relative humidity. In total, approximately two orders of magnitude vis-à-vis input sensitivity may be presented to the ADC depending on what kind of sensor is generating its analog input signal. Such a large range of input sensitivity in turn corresponds to a wide range of different margins that may be appropriate.

As such, the ability to program these margins provides for an ADC that can be used with a number of different sensors. In a system, such as a smartphone, having a number of such different sensors, the same ADC can be instantiated multiple times for each sensor (different ADCs for different sensors are not required). It is even possible to have one such ADC support multiple sensors where one analog input signal is multiplexed into the ADC from multiple sensors and specific margin values are programmed in/out of the ADC, depending on which sensor it is currently configured to support.

A multiplexer 211, 218 and adder 224 network is used to establish the margin and offset compensation (discussed further below) for the first comparator 202. Here, a first multiplexer 211 has a channel select input that is determined by what state the ADC is in. Specifically, if the ADC is tracking the input signal to detect threshold crossing, multiplexer 211 will pass a first channel from the output register 206 and multiplexer 218 will pass a first channel from register 217. The value from output register 206 and the margin value from register 217 are then added by adder 224 to generate the low threshold.

By contrast, when the ADC is in successive approximation mode, the first multiplexer 211 will select a second channel from the successive approximation register 214 and multiplexer 218 will pass a second channel from register 223 that provides for offset compensation (discussed further below). The output value from the successive approximation register and the offset compensation value are then added by adder 224 to generate an appropriate value for comparison against the sampled analog input signal during successive approximation mode. Although not shown in FIG. 2, the channel select of both multiplexers 211, 218 may be coupled to a state machine, such as the state machine within successive approximation logic 203, to set the correct multiplexer channel select value based on the ADC state.

Register 223 is used to provide a value that compensates for offsets within the first comparator 202 that may affect the accuracy of the analog-to-digital conversion process during successive approximation mode. Specifically, as is known in the art, a comparator can be modeled as detecting whether or not a signal at the + input has surpassed the reference signal at the − input. If the comparator has an offset, the comparator will raise its output signal if the input signal surpasses the reference value +/− the offset. Offsets are understood to be an artifact of manufacturing imperfections and/or tolerances.

If a comparator is provided a reference signal of Y and has an offset of R, the comparator will make a decision based on a comparison of its input against reference values of Y−R or Y+R (depending on the polarity of the offset) rather than making its decision based on a comparison of its input signal against a reference value of Y. Here, adder 224 and register 223 can be used to cancel out the offset. Specifically, if the first comparator 202 has a negative offset and therefore will make a decision against Y−R, adder 224 and register 223 can be used to add a value of +R to the value with the successive approximation register 204 which will have the effect of canceling the offset so that the comparator makes a decision against Y and not Y−R.

The margin values places in registers 216, 217 likewise can be adjusted to account for offsets consistent with the principles described just above. Additionally, although offsets were discussed at length above with respect to the comparators 202, 208, it is worth noting that offsets may also exist in the DACs 205, 207. The R and/or X values discussed above may therefore be adjusted to compensate for such offsets in the DACs 205, 207 as well.

In an embodiment, the second comparator 208 and DAC 207 are powered up during threshold crossing detection mode but are powered down during the successive approximation mode. Switch 220 is depicted to indicate that the second comparator 208 and the second DAC 207 are powered up/powered down depending on which mode the ADC is operating in. The first comparator 202 and DAC 205 are used for both modes and are therefore powered up for both modes.

Switch 220 may also be used to power down comparator 207 and 208 as a further power savings feature in which the ADC periodically puts itself to sleep while it is tracking the analog input signal for a threshold crossing. For example, in the case of slowly changing analog input signals, as a further power savings feature, the ADC may simply power down both pairs of DACs 205, 207 and comparators 202, 208 and not bother to monitor the analog input signal. After a time period of being off, the DACs and comparators may be turned on to see if the analog input signal has crossed its threshold. If not, the DACs and comparators may be put back to sleep again. Here, another switch, like switch 220 (not shown in FIG. 2), would be coupled to the supply voltage nodes of DAC 205 and comparator 207. In one embodiment the duration of the sleeping time period may be hardcoded (e.g., in the FSM) or programmable set by a user/system and/or firmware or software. In the case where the sleep time is programmable, another register (not shown in FIG. 2) would be present to receive the programmed sleep time value and provided it to the circuitry that controls the sleep/awake states of the ADC.

FIG. 2 also shows comparison and output interrupt logic 221. The output interrupt portion of logic 221 generates an interrupt once a new ADC output value has been determined to have been made. In normal circumstances, a new ADC output value will be latched into output register 206 from successive approximation register 204 at the end of a sequence of successive approximation recursions that converge to a value that is representative of the analog input signal. Consistent with the description of the circuit so far, a new successive convergence value should be "outside" the margins because a next analog-to-digital conversion operation should be triggered upon the analog input signal exceeding the upper threshold or falling below the lower threshold.

In some cases, however, it is conceivable that a new successive approximation sequence will converge to a value that is within rather than outside the margins. Here, it is possible that the analog output levels held by both DACs 205, 207 can drift over time. Conceivably the drift can trigger a next analog-to-digital conversion operation (even if the analog input signal has remained constant). For instance, recalling the margin setting of X, if DAC 205 causes the upper threshold to drop by a value of X even while the analog input signal remains unchanged, a new analog-to-digital conversion process will be triggered.

The new analog-to-digital conversion process will, however, produce the same output value as the previous output value. As such, the comparison portion of logic 221 checks the final value of the most recently completed analog-to-digital conversion process in register 204 against the last output value of the ADC in register 206 (logic 221 may receive a signal from the aforementioned ADC control (e.g., finite state machine) logic within the successive approximation logic 203 upon the successive approximation process being complete). Whether a new ADC output signal is formally declared, which includes shifting the contents of register 204 into register 206 and issuing an output interrupt, depends on the comparison of the contents of registers 204 and 206.

In an embodiment, if they are the same, the most recent analog-to-digital conversion process (whose output is within register 204) is not recognized. In an alternate embodiment, if the most recent analog-to-digital conversion process yields a value that is within a range from beneath the upper threshold to above the lower threshold the new analog-to-digital conversion process is not recognized. Which approach is taken may depend on designer choice or may be programmatically set (e.g., through a control register (not depicted)). Regardless of which approach is taken, note the ADC is internally squelching generation of a new output value if the new output value does not generate sufficiently new information. As such, downstream components will not have to respond to an analog input signal that in fact has not moved or has not moved much.

In an implementation, anytime an analog-to-digital conversion process is performed the DACs 205, 207 are reset to effectively correct them of their drift and place them at their correct output values. As such, the DACs will be properly reset even if the analog-to-digital conversion was determined to be redundant and not communicated to the higher system through interrupt 310. In an alternate embodiment, the DACs may be automatically reset on a periodic basis during threshold crossing detection mode to avoid the aforementioned problem of DAC drift causing the start of a new, unnecessary analog-to-digital conversion process. The aforementioned ADC control circuitry may be used to control the timing of these periodic resets.

Note that the embodiment discussed above with respect to FIG. 2 is designed such that the upper threshold DAC 205 and comparator 202 continue to remain enabled during the successive approximation process while the lower threshold DAC 207 and comparator 208 are turned off to conserve power. In alternate embodiments, the reverse design point may be implemented (the upper threshold DAC 205 and comparator 202 are turned off during the successive approximation process while the lower threshold DAC 207 and comparator 208 are used during the successive approximation sequence).

During initial start-up of the circuit of FIG. 2, in an embodiment, both of the margin values X that set the threshold levels to trigger a next successive approximation sequence may be set to a smaller value (e.g., 0) than they nominally are otherwise set to so that ADC circuit triggers its first successive approximation sequence shortly after it is first turned on/enabled. After the first successive approximation sequence converges to a final value the larger, nominal margin values X may be used to place the ADC in its normal runtime mode. An alternate embodiment could consist of a manual override control signal that the higher system could assert during initialization to trigger the first analog-to-digital conversion.

Additionally, note that in other embodiments both of the DAC and comparator pairs 202/205, 208/207 can be used during the successive approximation sequence during the analog-to-digital conversion process such that fewer steps would be needed to complete the conversion. For example, instead of stepping through each bit of the output value, the successive approximation logic 203 could start from the last known digital output and then go up or down from there depending on which comparator signals a threshold crossing.

Figure 4:
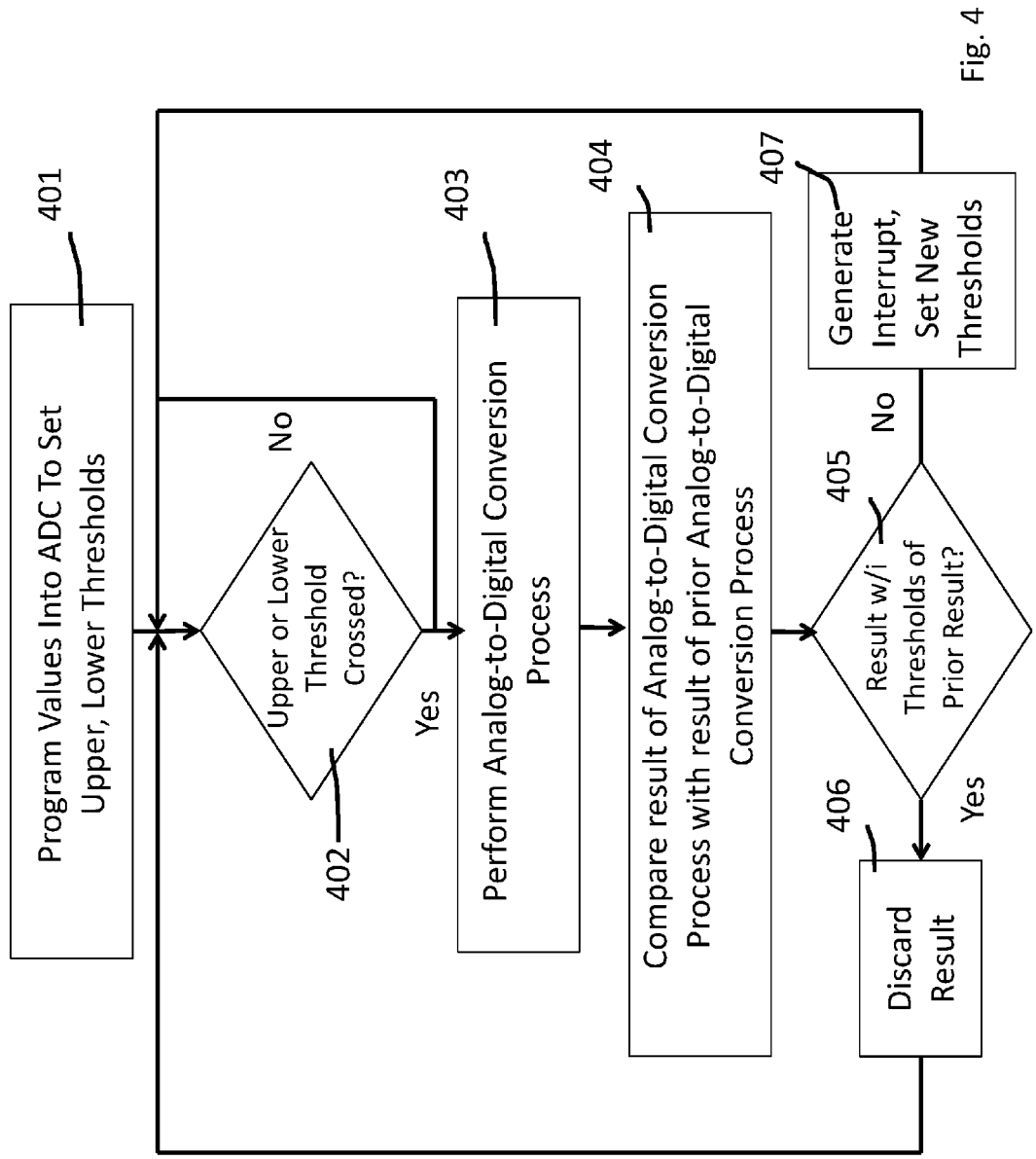
FIG. 4 shows a second methodology of operation of the improved ADC circuit of FIG. 2.

FIG. 4 shows a process performed by an ADC consistent with the discussion above of the ADC of FIGS. 2 and 3. As observed in FIG. 4, values to set upper and lower thresholds are programmed into the ADC 401. The ADC then tracks the analog input signal against the thresholds 402. If the analog input crosses either of the thresholds a next analog-to-digital conversion process is started 403. Although the analog-to-digital conversion process described at length above pertained to an approximation summation analog-to-digital conversion process, conceivably other types of analog-to-digital conversion processes may be utilized. These could be embodied as a pipelined or flash ADC that is sampled by the output of the margin comparators. After the analog-to-digital conversion process is completed its result is compared 404 against the result of the prior analog-to-digital conversion process. If the result is within the thresholds of the previous result 405, the result is discarded 406, elsewise an interrupt is generated, the result is presented as a new result of the ADC and new thresholds are generated 407.

Figure 5:
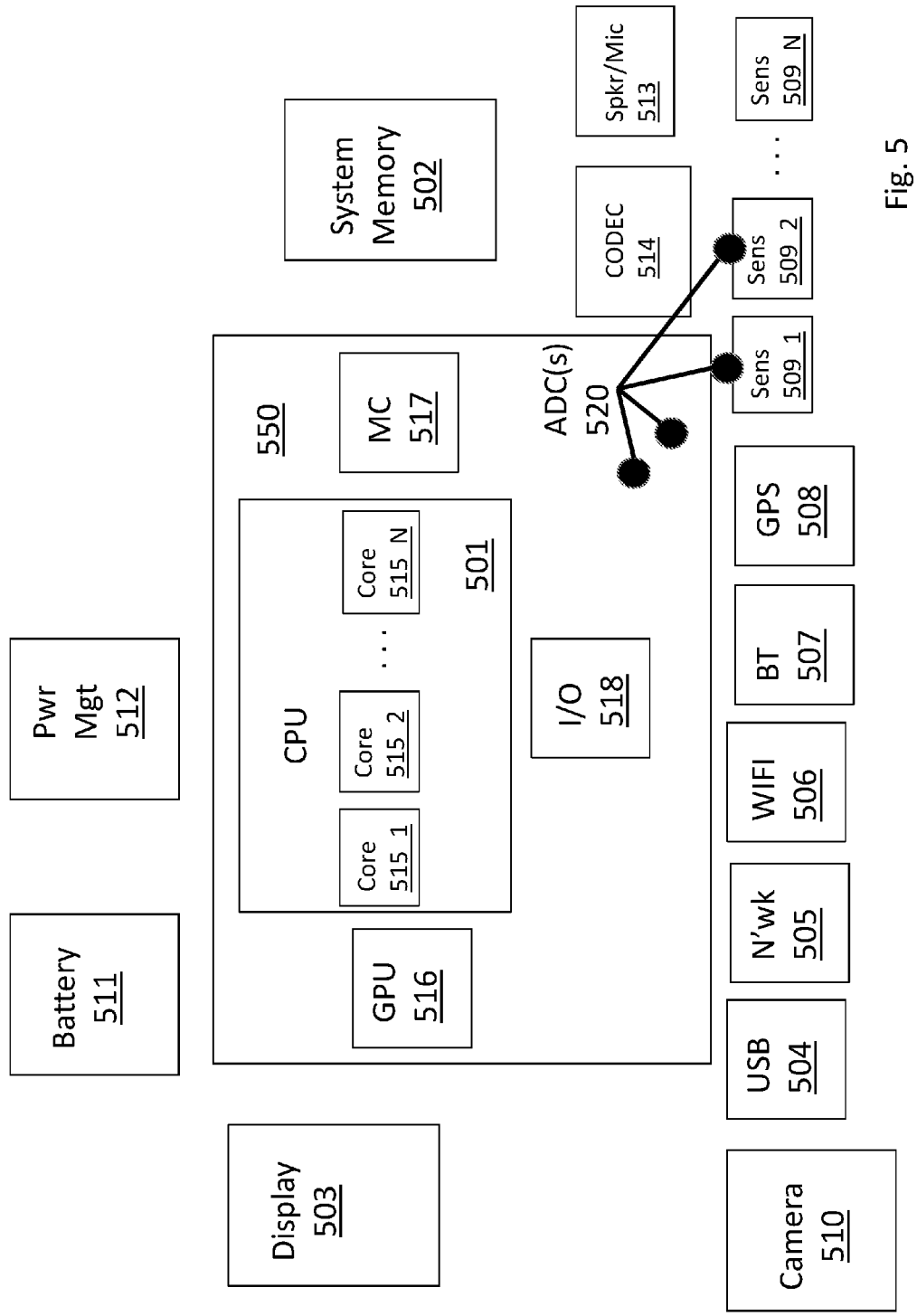
FIG. 5 shows a computing system.

FIG. 5 shows a depiction of an exemplary computing system 500 such as a personal computing system (e.g., desktop or laptop) or a mobile or handheld computing system such as a tablet device or smartphone. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502. The power management control unit 512 generally controls the power consumption of the system 500.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

The computing system as depicted in FIG. 5 also includes one or more ADCs 520 which may be implemented consistent the discussion of various ADC embodiments provided above with respect to FIGS. 2-4. An ADC circuit can exist as a back-end of a sensor, can reside on an applications processor or multi-core processor to receive a sensor's analog input signal or otherwise reside somewhere between the central processing unit and the sensor.

There may be an ADC associated with each sensor individually, or there may be one ADC used to service multiple sensors. In the case of the later, some kind of multiplexer would reside between the ADC and the sensors to multiplex into a single ADC the different analog signals from the different sensors that the single ADC supports. A state machine of some kind, implemented in hardware, software or firmware, or combination of any of these would also be used to place the ADC into a specific state for each sensor (where each state would, e.g., include its own unique threshold margin settings). Additionally the central processor unit would either include or at least be in sync with the state machine so it could comprehend which sensor is providing data when the ADC triggers its interrupt signal.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An analog-digital-converter, comprising:
   a first comparator and a first digital-to-analog converter, the first digital-to-analog converter coupled to a first reference input to the first comparator;
   a second comparator and a second digital-to-analog converter, the second digital-to-analog converter coupled to a second reference input to the second comparator;
   register space coupled to both the first and second digital-to-analog converters, the register space to help establish and store upper and lower thresholds for the first and second comparators that are respectively applied to the first and second reference inputs; and,
   an analog input signal node to provide an analog input signal to both the first and second comparators, the first and second comparators to trigger a next analog-to-digital conversion process in response to the analog input signal crossing either of their respective thresholds; and,
   additional register space to store a value used to compensate for an offset of at least one of the comparators and digital-to-analog converters.

2. The analog-to-digital converter of claim 1 further comprising:

analog-to-digital conversion circuitry to determine a digital value representative of said analog input signal in response to said trigger; and, circuitry to generate an interrupt commensurate with said digital value.

3. The analog-to-digital converter of claim 2 wherein the analog-to-digital conversion circuitry includes successive approximation circuitry and a successive approximation register.

4. The analog-to-digital converter of claim 3 wherein the successive approximation register is coupled to one of the digital-to-analog converters.

5. The analog-to-digital converter of claim 4 wherein a respective adder is coupled to the register space and resides along one or more paths from an output register of the analog-to-digital converter to the first and second digital-to-analog converters.

6. The analog-to-digital converter of claim 1 wherein the analog-to-digital comparator has a first mode to compare the analog input signal against the thresholds and a second mode to determine the digital value, wherein, one of the first and second comparator and digital-to-analog pairs is turned off while the digital value is being determined.

7. The analog-to-digital converter of claim 6 wherein one of the comparators compares the analog input signal against one of the thresholds during the first mode and also participates in the determination of the digital value during the second mode.

8. The analog-to-digital converter of claim 6 wherein both of the comparators are to compare the analog input signal against a different one of the thresholds during the first mode and are both used in the determination of the digital value during the second mode.

9. The analog-to-digital converter of claim 1 wherein the register space includes first register space to store a first value for the first comparator and digital-to-analog converter and includes second register space to store a second value for the second comparator and digital-to-analog converter.

10. An analog-to-digital converter circuit, comprising:
register space to keep one or more values to establish upper and lower thresholds of the analog-to-digital converter;
first and second comparators to compare an analog input signal against the upper and lower thresholds and to trigger an analog-to-digital conversion process in response to the analog input signal crossing one of the thresholds,
first logic circuitry to discard a result of the analog-to-digital conversion process if the result is within a prior analog-to-digital conversion process's thresholds or provide the result as an output;
second logic circuitry to generate an interrupt if the result is not within the prior analog-to-digital conversion process's thresholds; and,
additional register space to store a value used to compensate for an offset of at least one of the comparators.

11. The analog-to-digital converter circuit of claim 10 further comprising third logic circuitry to reset first and second digital-to-analog converters used to establish the upper and lower thresholds after the result is determined.

12. The analog-to-digital converter circuit of claim 10 further comprising state machine circuitry to cause one of the comparators to be disabled while the analog-to-digital conversion process is being performed.

13. The analog-to-digital converter circuit of claim 10 further comprising periodically turning the first and second comparators off as part of a mode in which the analog input signal is to be compared against the thresholds.

14. The analog-to-digital converter circuit of claim 10 wherein the analog-to-digital conversion process is a successive approximation analog-to-digital conversion process, the analog-to-digital converter comprising successive approximation circuitry.

15. A computing system, comprising:
one or more processing cores coupled to a memory controller;
system memory coupled to the memory controller;
one or more sensors;
an analog-to-digital converter coupled to the one or more sensors, the analog-to-digital converter comprising:
a first comparator and a first digital-to-analog converter, the first digital-to-analog converter coupled to a first reference input of the first comparator;
a second comparator and a second digital-to-analog converter, the second digital-to-analog converter coupled to a second reference input of the second comparator;
register space coupled to both the first and second digital-to-analog converters, the register space to help establish upper and lower thresholds for the first and second comparators;
an analog input signal node to provide an analog input signal to both the first and second comparators, the first and second comparators to trigger a next analog-to-digital conversion process in response to the analog input signal crossing either of their respective thresholds; and,
additional register space to store a value used to compensate for an offset of at least one of the comparators and digital-to-analog converters.

16. The computing system of claim 15 wherein the computing system is a mobile computing system and the one or more processing cores are integrated on an applications processor.

17. The computing system of claim 16 wherein the analog-to-digital converter is integrated on the applications processor.

18. The computing system of claim 15 the one or more sensors include any of:
a temperature sensor;
a humidity sensor;
a pressure sensor;
gyroscope;
an accelerometer;
a magnetometer.

19. The computing system of claim 15 wherein the analog-to-digital converter comprises successive approximation circuitry and a successive approximation register.

20. The computing system of claim 15 wherein the successive approximation register is coupled to one of the digital-to-analog converters.

* * * * *